US008618720B2

(12) United States Patent
Paleczny et al.

(10) Patent No.: US 8,618,720 B2
(45) Date of Patent: Dec. 31, 2013

(54) PIEZOELECTRIC ASSEMBLY

(75) Inventors: Todd Robert Paleczny, Heidelberg (CA); Arnett Ryan Weber, Waterloo (CA); Dietmar Frank Wennemer, Waterloo (CA); Cameron Russell Steeves, Waterloo (CA); Patrick Clement Strittmatter, Frisco, CA (US)

(73) Assignee: BlackBerry Limited, Waterloo (CA)

( * ) Notice: Subject to any disclaimer, the term of this patent is extended or adjusted under 35 U.S.C. 154(b) by 521 days.

(21) Appl. No.: 12/895,953

(22) Filed: Oct. 1, 2010

(65) Prior Publication Data

US 2011/0134059 A1 Jun. 9, 2011

Related U.S. Application Data

(60) Provisional application No. 61/247,651, filed on Oct. 1, 2009.

(51) Int. Cl.
*H01L 41/047* (2006.01)

(52) U.S. Cl.
USPC .......................................... 310/344; 310/365

(58) Field of Classification Search
USPC .................................. 310/344, 365
See application file for complete search history.

(56) References Cited

U.S. PATENT DOCUMENTS

| | | | | |
|---|---|---|---|---|
| 6,369,489 | B1 * | 4/2002 | Sawai et al. | 310/326 |
| 6,442,812 | B1 * | 9/2002 | Kovacich et al. | 29/25.35 |
| 6,611,182 | B2 * | 8/2003 | Ojima | 333/189 |
| 6,791,098 | B2 * | 9/2004 | Pletner et al. | 250/548 |
| 6,980,388 | B2 * | 12/2005 | Ishikawa et al. | 360/75 |
| 7,358,654 | B2 * | 4/2008 | Aromin | 310/348 |
| 2002/0024408 | A1 * | 2/2002 | Iwata et al. | 333/191 |
| 2010/0037693 | A1 * | 2/2010 | Matsuo | 73/514.34 |
| 2010/0187948 | A1 * | 7/2010 | Sinha et al. | 310/313 C |

FOREIGN PATENT DOCUMENTS

| | | |
|---|---|---|
| EP | 1329963 A1 | 7/2003 |
| EP | 2079115 A2 | 7/2009 |
| WO | 2009041564 A1 | 4/2009 |

OTHER PUBLICATIONS

Goldman, et al.; A vertically integrated media-isolated absolute pressure sensor. vol. 66, No. 1-3, Apr. 1, 1998; pp. 155-159, XP004143985.
European Search Report; European Pat. Application 10185447.9; dated Nov. 30, 2010.
European Examination Report dated Aug. 3, 2011. In application No. 10185447.9.
Office Action mailed Mar. 7, 2013, in corresponding Canadian patent application No. 2,716,232.

* cited by examiner

*Primary Examiner* — Thomas Dougherty
(74) *Attorney, Agent, or Firm* — Novak Druce Connolly Bove + Quigg LLP

(57) ABSTRACT

A piezoelectric assembly is described. In accordance with one embodiment, there is provided a piezoelectric assembly comprising: an electrode assembly; a signal electrical connector electrically connected to the electrode assembly; a reference electrical connector electrically connected to the electrode assembly; and a spacer positioned about a perimeter of the electrode assembly and disposed between the signal electrical connector and the reference electrical connector such that no electrical communication is provided between the signal electrical connector and the reference electrical connector through the spacer; wherein a humidity barrier space is defined between the signal electrical connector, the reference electrical connector and the spacer, and wherein the electrode assembly is disposed in the humidity barrier space.

20 Claims, 5 Drawing Sheets

PIEZOELECTRIC ASSEMBLY

RELATED APPLICATION DATA

The present application claims priority to, and the benefit of, provisional U.S. patent application Ser. No. 61/247,651, filed Oct. 1, 2009, which is incorporated herein by reference in its entirety.

TECHNICAL FIELD

The present disclosure relates generally to piezoelectric assemblies. In particular, the present disclosure relates to piezoelectric assemblies suitable for electronic devices including devices having a touch sensitive display.

BACKGROUND

Electronic devices, including portable electronic devices, have gained widespread use and can provide a variety of functions including, for example, telephonic, electronic messaging and other personal information manager (PIM) application functions. Portable electronic devices can include several types of devices including mobile stations such as simple cellular telephones, smart telephones, wireless PDAs, and laptop computers with wireless 802.11 or Bluetooth capabilities. These devices run on a wide variety of networks from data-only networks such as Mobitex and DataTAC to complex voice and data networks such as GSM/GPRS, CDMA, EDGE, UMTS and CDMA2000 networks.

Such devices often employ a touch sensitive display. A tactile mechanism is typically incorporated into the touch sensitive display to provide a tactile feedback when a user interacts with the touch sensitive display. For example, there may be a mechanical switch incorporated into the touch sensitive display to mimic the feel of a physical keyboard. Other mechanisms may use a piezoelectric assembly that provides tactile feedback.

BRIEF DESCRIPTION OF THE DRAWINGS

Embodiments of the present disclosure will now be described, by way of example only, with reference to the attached Figures, wherein.

DETAILED DESCRIPTION OF EXAMPLE EMBODIMENTS

Figure 1:
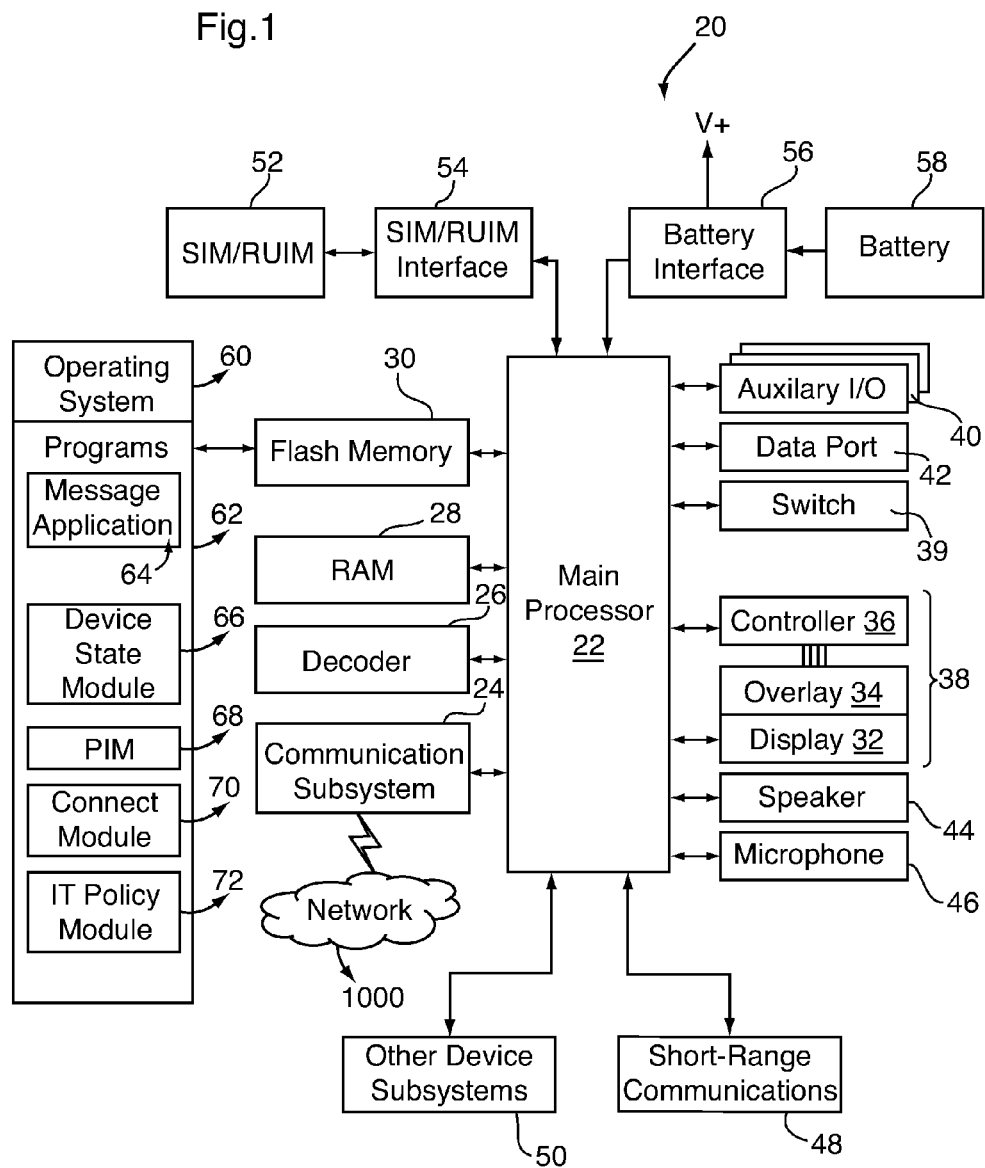
FIG. 1 is a block diagram of a portable electronic device according to an example.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. A person skilled in the art would understand that variations and modifications, both those currently known and those that may be later developed, are possible within the scope of the disclosure. Also, the description is not to be considered as limiting the scope of the embodiments described herein.

In accordance with one embodiment, there is provided a piezoelectric assembly comprising: an electrode assembly; a signal electrical connector electrically connected to the electrode assembly; a reference electrical connector electrically connected to the electrode assembly; and a spacer positioned about a perimeter of the electrode assembly and disposed between the signal electrical connector and the reference electrical connector such that no electrical communication is provided between the signal electrical connector and the reference electrical connector through the spacer; wherein a humidity barrier space is defined between the signal electrical connector, the reference electrical connector and the spacer, and wherein the electrode assembly is disposed in the humidity barrier space.

In accordance with another embodiment, there is provided a portable electronic device comprising: a processor; a touch-sensitive display coupled to the processor; the piezoelectric assembly as described herein. In some example embodiments, the piezoelectric assembly is disposed adjacent to the touch-sensitive display, the piezoelectric assembly being in a concave configuration away from the touch-sensitive display in an unactuated state and being disposed in a substantially planar configuration flush with the touch-sensitive display in an actuated state, the piezoelectric assembly being actuated in response to a signal representing a touch input and being unactuated in the absence of the signal representing the touch input.

The embodiments described herein generally relate to an electronic device including a touch-sensitive display. Examples of such electronic devices are portable electronic devices, including communication devices. Examples of portable electronic devices include mobile, or handheld, wireless communication devices such as pagers, cellular phones, cellular smart-phones, wireless organizers, personal digital assistants, wirelessly enabled notebook computers and the like.

In some embodiments, the portable electronic device is a two-way communication device with advanced data communication capabilities including the capability to communicate with other portable electronic devices or computer systems through a network of transceiver stations. In some embodiments, the portable electronic device also has the capability to allow voice communication. Depending on the functionality provided by the portable electronic device, it may be referred to as a data messaging device, a two-way pager, a cellular telephone with data messaging capabilities, a wireless Internet appliance, or a data communication device (with or without telephony capabilities). In some embodiments, the portable electronic device is a portable device without wireless communication capabilities such as a handheld electronic game device, digital photograph album, digital camera and the like.

Referring first to FIG. 1, there is shown therein a block diagram of an example embodiment of a portable electronic device 20. The portable electronic device 20 includes a number of components such as the main processor 22 that controls the overall operation of the portable electronic device 20. Communication functions, including data and voice communications, are performed through a communication subsystem 24. Data received by the portable electronic device 20 can be decompressed and decrypted by a decoder 26, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). In some examples, the communication subsystem 24 receives messages from and send messages to a wireless network 1000. In this example embodiment of the portable electronic device 20, the communication subsystem 24 is configured in accordance with the Global System for Mobile Communication (GSM) and General Packet Radio Services (GPRS) standards. The GSM/GPRS wireless network is used worldwide. New standards such as Enhanced Data GSM Environment (EDGE) and Universal Mobile Telecommunications Service (UMTS) are believed to have similarities to the network behavior described herein, and it will also be understood by persons skilled in the art that the embodiments described herein may use any other suitable standards that are developed in the future. The wireless link connecting the communication subsystem 24 with the wireless network 1000, in some examples, represents one or more different Radio Frequency (RF) channels, operating according to defined protocols specified for GSM/GPRS communications. With newer network protocols, these channels may be capable of supporting both circuit switched voice communications and packet switched data communications.

Although the wireless network 1000 associated with the portable electronic device 20 is a GSM/GPRS wireless network in one example implementation, other wireless networks are associated with the portable electronic device 20 in other examples. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include Wi-Fi™ or other IEEE 802.11 network, Mobitex™ and DataTAC™ network communication systems. Examples of other voice-centric data networks include Personal Communication Systems (PCS) networks like GSM and Time Division Multiple Access (TDMA) systems. In some examples, the main processor 22 interacts with additional subsystems such as a Random Access Memory (RAM) 28, a flash memory 30, a display 32 with a touch-sensitive overlay 34 connected to an electronic controller 36 that together make up a touch-sensitive display 38, a tactile mechanism 39, an auxiliary input/output (I/O) subsystem 40, a data port 42, a speaker 44, a microphone 46, short-range communications 48 and other device subsystems 50. The touch-sensitive overlay 34 and the electronic controller 36 provide a touch-sensitive input device and, in some examples, the main processor 22 interacts with the touch-sensitive overlay 34 via the electronic controller 36.

In some examples, some of the subsystems of the portable electronic device 20 perform communication-related functions, whereas other subsystems provide "resident" or on-device functions. In some examples, the display 32 and the touch-sensitive overlay 34 are used for both communication-related functions, such as entering a text message for transmission over the network 1000, and device-resident functions such as a calculator or task list.

The portable electronic device 20 can send and receive communication signals over the wireless network 1000 after network registration or activation procedures have been completed. In some examples, network access is associated with a subscriber or user of the portable electronic device 20. In some examples, to identify a subscriber according to the present embodiment, the portable electronic device 20 uses a SIM/RUIM card 52 (i.e. Subscriber Identity Module or a Removable User Identity Module) inserted into a SIM/RUIM interface 54 for communication with a network such as the network 1000. The SIM/RUIM card 52 is one type of a conventional "smart card" that can be used to identify a subscriber of the portable electronic device 20 and to personalize the portable electronic device 20, among other things. In an example embodiment, the portable electronic device 20 is not fully operational for communication with the wireless network 1000 without the SIM/RUIM card 52. By inserting the SIM/RUIM card 52 into the SIM/RUIM interface 54, a subscriber can access all subscribed services. Examples of services include: web browsing and messaging such as e-mail, voice mail, Short Message Service (SMS), and Multimedia Messaging Services (MMS). Examples of more advanced services include: point of sale, field service and sales force automation. In some examples, the SIM/RUIM card 52 includes a processor and memory for storing information. Once the SIM/RUIM card 52 is inserted into the SIM/RUIM interface 54, it is coupled to the processor 22. In order to identify the subscriber, the SIM/RUIM card 52 can include some user parameters such as an International Mobile Subscriber Identity (IMSI). An advantage of using the SIM/RUIM card 52 is that a subscriber is not necessarily bound by any single physical portable electronic device. In some examples, the SIM/RUIM card 52 stores additional subscriber information for a portable electronic device as well, including datebook (or calendar) information and recent call information. Alternatively, user identification information can also be programmed into the flash memory 30.

In the example shown, the portable electronic device 20 is a battery-powered device and includes a battery interface 56 for receiving one or more rechargeable batteries 58. In some example embodiments, the battery 58 is a smart battery with an embedded microprocessor. The battery interface 56 is coupled to a regulator (not shown), which assists the battery 58 in providing power V+ to the portable electronic device 20. Although examples of current technology make use of a battery, future technologies such as micro fuel cells may provide the power to the portable electronic device 20.

In the example shown, the portable electronic device 20 also includes an operating system 60 and software components 62 to 72 which are described in more detail below. The operating system 60 and the software components 62 to 72 that are executed by the main processor 22 are typically stored in a persistent store such as the flash memory 30, which, in other examples, is alternatively a read-only memory (ROM) or similar storage element (not shown). Those skilled in the art will appreciate that in some example embodiments, portions of the operating system 60 and the software components 62 to 72, such as specific device applications, or parts thereof, are temporarily loaded into a volatile store such as the RAM 28. Other software components can also be included, as is well known to those skilled in the alt.

The subset of software applications 62 that control basic device operations, including data and voice communication applications, in some examples, are installed on the portable electronic device 20 during its manufacture. Other software applications, in some examples, include a message application 64 that can be any suitable software program that allows a user of the portable electronic device 20 to send and receive electronic messages. Various alternatives exist for the message application 64 as is well known to those skilled in the art. Messages that have been sent or received by the user are typically stored in the flash memory 30 of the portable electronic device 20 or some other suitable storage element in the portable electronic device 20. In some example embodiments, some of the sent and received messages are stored remotely from the device 20 such as in a data store of an associated host system that the portable electronic device 20 communicates with.

The software applications 62 can further include a device state module 66, a Personal Information Manager (PIM) 68, and other suitable modules (not shown). In some examples, the device state module 66 provides persistence, i.e. the device state module 66 ensures that important device data is stored in persistent memory, such as the flash memory 30, so that the data is not lost when the portable electronic device 20 is turned off or loses power.

In some examples, the PIM 68 includes functionality for organizing and managing data items of interest to the user, such as, but not limited to, e-mail, contacts, calendar events, voice mails, appointments, and task items. A PIM application, in some examples, has the ability to send and receive data items via the wireless network 1000. In some examples, PIM data items are seamlessly integrated, synchronized, and updated via the wireless network 1000 with the portable electronic device subscriber's corresponding data items stored and/or associated with a host computer system. This functionality creates a mirrored host computer on the portable electronic device 20 with respect to such items. This can be particularly advantageous when the host computer system is the portable electronic device subscriber's office computer system.

In the example shown, the portable electronic device 20 also includes a connect module 70, and an information technology (IT) policy module 72. The connect module 70, in some examples, implements the communication protocols that are required for the portable electronic device 20 to communicate with the wireless infrastructure and any host system, such as an enterprise system, that the portable electronic device 20 is authorized to interface with.

In some examples, the connect module 70 includes a set of APIs that can be integrated with the portable electronic device 20 to allow the portable electronic device 20 to use any number of services associated with the enterprise system. The connect module 70, in some examples, allows the portable electronic device 20 to establish an end-to-end secure, authenticated communication pipe with the host system. A subset of applications for which access is provided by the connect module 70 can be used to pass IT policy commands from the host system to the portable electronic device 20. This can be done in a wireless or wired manner. These instructions can then be passed to the IT policy module 72 to modify the configuration of the device 20. Alternatively, in some cases, the IT policy update can also be done over a wired connection.

Other types of software applications can also be installed on the portable electronic device 20. These software applications can be third party applications, which are added after the manufacture of the portable electronic device 20. Examples of third party applications include games, calculators, utilities, etc.

The additional applications can be loaded onto the portable electronic device 20 through at least one of the wireless network 1000, the auxiliary I/O subsystem 40, the data port 42, the short-range communications subsystem 48, or any other suitable device subsystem 50. This flexibility in application installation has the potential to increase the functionality of the portable electronic device 20 and to provide enhanced on-device functions, communication-related functions, or both. For example, secure communication applications, in some cases, enable electronic commerce functions and other such financial transactions to be performed using the portable electronic device 20.

In some examples, the data port 42 enables a subscriber to set preferences through an external device or software application and extends the capabilities of the portable electronic device 20 by providing for information or software downloads to the portable electronic device 20 other than through a wireless communication network. The alternate download path, in some examples, is used to load an encryption key onto the portable electronic device 20 through a direct and thus reliable and trusted connection to provide secure device communication.

The data port 42 can be any suitable port that enables data communication between the portable electronic device 20 and another computing device. The data port 42 can be a serial or a parallel port. In some instances, the data port 42 can be a USB port that includes data lines for data transfer and a supply line that can provide a charging current to charge the battery 58 of the portable electronic device 20.

In some examples, the short-range communications subsystem 48 provides for communication between the portable electronic device 20 and different systems or devices, without the use of the wireless network 1000. In some examples, the short-range communications subsystem 48 includes an infrared device and associated circuits and components for short-range communication. Examples of short-range communication standards include standards developed by the Infrared Data Association (IrDA), Bluetooth, and the 802.11 family of standards developed by IEEE.

In an example use, a received signal such as a text message, an e-mail message, or web page download is processed by the communication subsystem 24 and input to the main processor 22. The main processor 22 processes the received signal for output to the display 32 or alternatively to the auxiliary I/O subsystem 40. In some examples, a subscriber can also compose data items, such as e-mail messages, for example, using the touch-sensitive overlay 34 on the display 32 that are part of the touch-sensitive display 38, and possibly the auxiliary I/O subsystem 40. In some examples, the auxiliary I/O subsystem 40 includes devices such as: a mouse, track ball, optical navigation module, infrared fingerprint detector, or a roller wheel with dynamic button pressing capability. In some examples, a composed item is transmitted over the wireless network 1000 through the communication subsystem 24.

For voice communications, the overall operation of the portable electronic device 20, in some examples, is substantially similar, except that the received signals are output to the speaker 44, and signals for transmission are generated by the microphone 46. Alternative voice or audio I/O subsystems, such as a voice message recording subsystem, can also be implemented on the portable electronic device 20. Although voice or audio signal output are accomplished primarily through the speaker 44 in some examples, the display 32 can also be used to provide additional information such as the identity of a calling party, duration of a voice call, or other voice call related information.

Figure 2A:
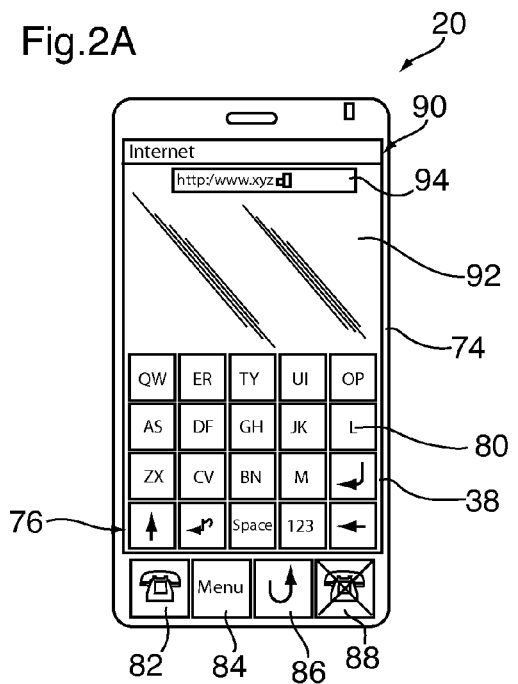
FIG. 2A is a front view of an example portable electronic device shown in a portrait orientation.

Reference is now made to FIG. 2A, which shows a front view of an example portable electronic device 20 in portrait orientation. In the example shown, the portable electronic device 20 includes a housing 74 that houses the internal components that are shown in FIG. 1 and frames the touch-sensitive display 38 such that the touch-sensitive display 38 is exposed for user-interaction therewith when the portable electronic device 20 is in use. In the example shown in FIG. 2A, the touch-sensitive display 38 includes a portrait mode virtual keyboard 76 for user entry of data in the form of, for example, text during operation of the portable electronic device 20. It will be appreciated that such a virtual keyboard 76, in some examples, is used for data entry in any suitable application such as in an electronic mail application, during electronic mail composition or in any other suitable application. In some examples, the portrait mode virtual keyboard 76 of FIG. 2A is provided for data entry in an Internet browser application and is shown as a reduced keyboard for example purposes. The present disclosure is not limited to the portrait mode virtual keyboard 76 shown, as other keyboards including other reduced keyboards or full keyboards are possible. Examples of suitable keyboards include full or reduced QWERTY keyboards, full or reduced Dvorak keyboards, and other full or reduced keyboards, including keyboards adapted for non-Roman text input, such as Korean, Chinese or Japanese text input.

Figure 2B:
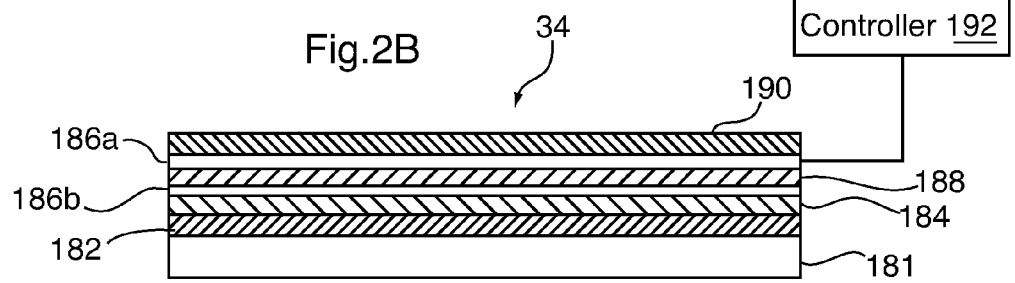
FIG. 2B shows a cutaway view of an example touch-sensitive display of the portable electronic device of FIG. 1.

The touch-sensitive display 38, in some examples, is any suitable touch-sensitive display 38 such as a capacitive touch-sensitive display. For example, a capacitive touch-sensitive display 38 includes the display device, such as an LCD display 32 and the touch-sensitive overlay 34, in the form of a capacitive touch-sensitive overlay 34, as shown in FIG. 2B. In some example embodiments, the capacitive touch-sensitive overlay 34 includes a number of layers in a stack and is fixed to the input device 142 via a suitable optically clear adhesive. The layers include, for example, a substrate 181 fixed by a suitable adhesive (not shown), a ground shield layer 182, a barrier layer 184, a pair of capacitive touch sensor layers including an outer capacitive touch sensor layer 186a and an inner capacitive touch sensor layer 186b separated by a substrate or other barrier layer 188, and a cover layer 190 fixed to the outer capacitive touch sensor layer 186a by a suitable adhesive (not shown). The capacitive touch sensor layers are made of any suitable material such as patterned indium tin oxide (ITO).

Figure 3:
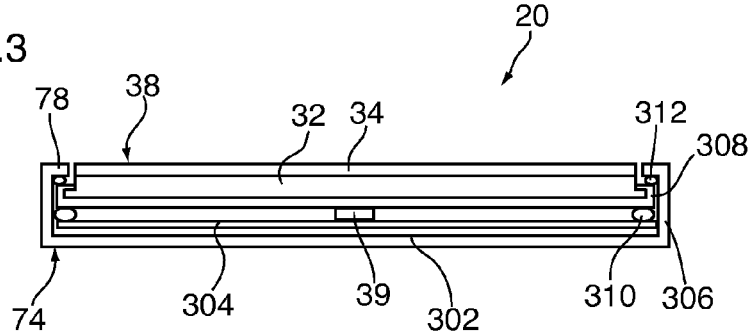
FIG. 3 is a simplified sectional side view of the portable electronic device of FIG. 2A (not to scale)

Reference is now made to FIG. 3, showing a simplified sectional side view of the portable electronic device of FIG. 2A (not to scale), with a tactile mechanism 39. In the example shown in FIG. 3, the housing 74 includes a back 302, a frame 78, which frames the touch-sensitive display 38, sidewalls 306 that extend between and are generally perpendicular to the back 302 and the frame 78, and a base 304 that is spaced from and generally parallel to the back 302. The base 304 can be any suitable base and can include, for example, a printed circuit board or flex circuit board. In some examples, the back 302 includes a plate (not shown) that is releasably attached for insertion and removal of, for example, the battery 58 and the SIM/RUIM card 52 described above. It will be appreciated that the back 302, the sidewalls 306 and the frame 78 can be injection molded, for example. In the example portable electronic device 20 shown in FIG. 2A, the frame 78 is generally rectangular with rounded corners although other shapes are possible.

The display 32 and the touch-sensitive overlay 34 can be supported on a support tray 308 of suitable material such as magnesium for providing mechanical support to the display 32 and touch-sensitive overlay 34. In the example shown, the display 32 and touch-sensitive overlay 34 are biased away from the base 304, toward the frame 78 by biasing elements 310 such as gel pads between the support tray 308 and the base 304. Compliant spacers 312, which can also be in the form of gel pads for example, are located between an upper portion of the support tray 308 and the frame 78. In some examples, the touch-sensitive display 38 is moveable within the housing 74 as the touch-sensitive display 38 can be moved toward the base 304, thereby compressing the biasing elements 310. The touch-sensitive display 38 can also be pivoted within the housing 74 with one side of the touch-sensitive display 38 moving toward the base 304, thereby compressing the biasing elements 310 on the same side of the touch-sensitive display 38 that moves toward the base 304.

In the present example, the tactile mechanism 39 is supported on one side of the base 304, which can be a printed circuit board, while the opposing side provides mechanical support and electrical connection for other components (not shown) of the portable electronic device 20. The tactile mechanism 39 can be located between the base 304 and the support tray 308. The tactile mechanism 39, for example a piezoelectric assembly, in some examples is located in any suitable position to provide adequate tactile feedback to an interaction with the touch-sensitive display 38. In the present example, the tactile mechanism 39 is in contact with the support tray 308. Thus, actuation of the tactile mechanism 39, for example by a displacement towards or away from the touch sensitive display 38, is able to provide the user with a positive tactile feedback during user interaction with the user interface of the portable electronic device 20. It will be appreciated that the tactile mechanism 39 in some examples is actuated in response to a signal, for example from the processor 22, which in turn is in response to a physical force sensed at the touch sensitive display 38, to indicate a user interaction. Although a single tactile mechanism 39 is shown any suitable number of tactile mechanisms 39 can be used.

For example, a touch event is detected upon user touching of the touch-sensitive display 38. Typically, such a touch event is determined upon a user touch at the touch-sensitive display 38 for selection Of for example, a feature in a list, such as a message or other feature for scrolling in the list or selecting a virtual input key. For example, signals are sent from the touch-sensitive overlay 34 to the controller 36 when a suitable object such as a finger or other conductive object held in the bare hand of a user, is detected. Thus, the touch event is detected and an X and a Y location of the touch is determined. The X and Y location of the touch, in some examples, is determined to fall within the touch-sensitive area defined by the boundary on the touch-sensitive display 38.

Reference is again made to FIG. 2B. In the present example, the X and Y locations of a touch event are both determined, with the X location determined by a signal generated as a result of capacitive coupling with one of the touch sensor layers 186a, 186b and the Y location determined by the signal generated as a result of capacitive coupling with the other of the touch sensor layers 186a, 186b. In this example, each of the touch-sensor layers 186a, 186b provides a signal to the controller 36 as a result of capacitive coupling with a suitable object such as a finger of a user or a conductive object held in a bare hand of a user resulting in a change in the electric field of each of the touch sensor layers.

In some examples, the outer touch sensor layer 186a is connected to a capacitive touch screen controller 192 in the portable electronic device 20 for conducting a continuous electrical current across the inner touch sensor layer 186b and detecting a change in the capacitance as a result of capacitive coupling between, for example, the finger of a user or a conductive stylus held by a user, and the outer touch sensor layer 186a. Thus, the change in capacitance acts as a signal to the capacitive touch screen controller 192, which senses the touch or near touch, on the touch-sensitive display 38.

When a user places a finger, or other conductive object (e.g., a conductive stylus) on capacitive touch sensitive overlay 34 without applying force to cause the outer and inner touch sensor layers 186a, 186b to contact each other, capacitive coupling of the finger or conductive object with the outer touch sensor layer 186a occurs, resulting in a signal at the capacitive touch screen controller 192. Capacitive coupling also occurs through the cover layer 190 and through a small air gap (not shown). Thus, capacitive coupling occurs, resulting in a signal being sent to the capacitive touch screen controller 192, when the finger or other conductive object (e.g., held in the bare hand of a user) approaches the surface of the cover layer 190 and when contacting the cover layer 190, prior to force being applied to the cover layer 190 to force the outer and inner touch sensor layers 186a, 186b into contact with each other. The sensitivity of the capacitive touch screen controller 192 can therefore be set to detect an approaching finger (or other conductive object) at a small distance away from the cover layer 190 of, for example, 9 millimeters (mm) or less. In some examples, the location of approach is not determined, however the approach of a finger or other conductive object that is proximal the outer touch sensor layer 186a is determined. Thus, the outer touch sensor layer 186a and the capacitive touch screen controller 192 act to detect proximity, detecting a finger or conductive object proximal the surface of the cover layer 190.

In some examples, the signals represent the respective X and Y touch location values. It will be appreciated that other attributes of the user's touch on the capacitive touch sensitive overlay 34 can be determined. For example, the size and the shape of the touch on the capacitive touch sensitive overlay 34 can be determined in addition to the location (e.g., X and Y values) based on the signals received at the controller 36 from the touch sensor layers 186a, 186b.

Referring to FIG. 2A, it will be appreciated that a user's touch on the capacitive touch sensitive overlay 34, in some examples, is determined by determining the X and Y touch locations and user-selected input is determined based on the X and Y touch locations and the application executed by the processor 22. For example, this determination is carried out by the processor 22 using one or more software modules 62, including the specific application being executed. In the example screen shown in the front view of FIG. 2A, the application provides the virtual keyboard 76 having a plurality of virtual input keys or buttons, which can be selected by the user. The user selected virtual input key, in an example, is matched to the X and Y touch location. Thus, the button selected by the user is determined based on the X and Y touch location and the application.

In the example shown in FIG. 2A, the user is able to text via the virtual keyboard 76, selecting characters or symbols associated with the virtual input keys, such as alphanumeric characters from the virtual keyboard 76, by touching the touch-sensitive display at the location of the characters corresponding to the virtual input keys of the virtual keyboard 76. In example embodiments of the portable electronic device 20, the text or data entry is accomplished by a "click to enter" operation. In this example, once the user has selected a character or symbol, the character or symbol is entered by depressing the virtual input key on the capacitive touch sensitive overlay 34 with sufficient force to overcome the bias of the capacitive touch sensitive overlay 34, to cause movement of the touch-sensitive display 38. The selection of the virtual input key 80 (e.g., based on the X and Y location on the touch-sensitive display) results in signals that may be received by the main processor 22, thereby entering the corresponding character or symbol for rendering on the touch-sensitive display.

The processor 22, in some examples, also correspondingly sends a signal to the tactile mechanism 39 to flex inwards or outwards, for example in the case of a piezoelectric assembly, to provide a tactile feedback to the user. The "click to enter" operation thus is able to provide a tactile feedback confirming the entry to the user, thereby reducing the chance of inadvertent double entry requiring correction. For example, this has the potential to also reduce the need for additional user interaction and use time, thereby reducing battery consumption. The click entry has the potential to also allow the user to touch the device and ensure the correct character or symbol is selected before entry of that character or symbol by clicking. In some examples, the characters are alphanumeric characters, although other characters are also possible, such as characters for non-English languages.

According to the present example as illustrated in FIG. 2A, the main processor 22 receives a user-selection of an Internet browser application for browsing the Internet by, for example, determination of a touch event at an Internet browser icon (not shown) displayed on the touch-sensitive display 38.

For illustrative purposes, the virtual keyboard 76, in the example shown in FIG. 2A, is rendered in the portrait mode. Devices, such as accelerometers, can be used to determine the relative orientation of the portable electronic device 20 and change the orientation of the touch-sensitive display accordingly. In some examples, the virtual input keys or buttons 80 are rendered with the alphanumeric characters and other keyboard buttons displayed in an upright position for the user. The portable electronic device 20 can be operated in any suitable mode for determining a user-desired one of the letters upon determination of a touch event at the respective one of the virtual input keys or buttons 80 of the virtual keyboard 76. For example, letters can be selected using a single-tap mode, multi-tap mode, a text prediction mode or using any other suitable mode. The portable electronic device 20 according to the present example also includes four physical buttons 82, 84, 86, 88 in the housing 74 for user-selection for performing functions or operations including an "off-hook" button 82 for placing an outgoing cellular telephone call or receiving an incoming cellular telephone call, a Menu button 84 for displaying a context-sensitive menu or submenu, an escape button 86 for returning to a previous screen or exiting an application, and an "on-hook" button 88 for ending a cellular telephone call. The remainder of the buttons shown on the face of the example portable electronic device of FIG. 2A are virtual buttons or input keys 80 on the touch-sensitive display 38. However, it is also appreciated that the buttons 82, 84, 86 and 88 could also be virtual buttons, similar to the virtual input keys 80 described above.

In some examples, along with the virtual keyboard 76, a display area is rendered, which in the present example is a portrait mode display area 90 that is a portrait mode Internet browser display screen 92. In some examples, the display area is provided in the portrait mode as a result of determination of the orientation at the accelerometer (not shown). In some examples, the display area is rendered above the portrait mode virtual keyboard 76 when the portable electronic device 20 is in the portrait orientation.

As a result of touching any of the virtual buttons or input keys 80 of the virtual keyboard 76, data input received from the virtual keyboard 76, in some examples, is rendered in a data entry field 94 of the Internet browser display screen 92. In the example shown, input is received in the form of user selection of characters or symbols by touching the virtual buttons or input keys 80 so as to select the desired character or symbol associated with the virtual button or input key 80 in either the portrait mode or landscape mode. In the example shown in FIG. 2A, the user enters "http://www.xyz.c" and the data received is displayed in the data entry field 94 of the portrait mode Internet browser display screen 92.

In some examples, when entering data, the user is able to turn the portable electronic device 20 to a different orientation to provide a different keyboard layout such as to change from a reduced keyboard layout in the portrait orientation to a full keyboard layout in the landscape orientation, as in the present example. In another example, the user is able to also choose to turn the portable electronic device 20 to provide a different display area for the application.

Figure 4:
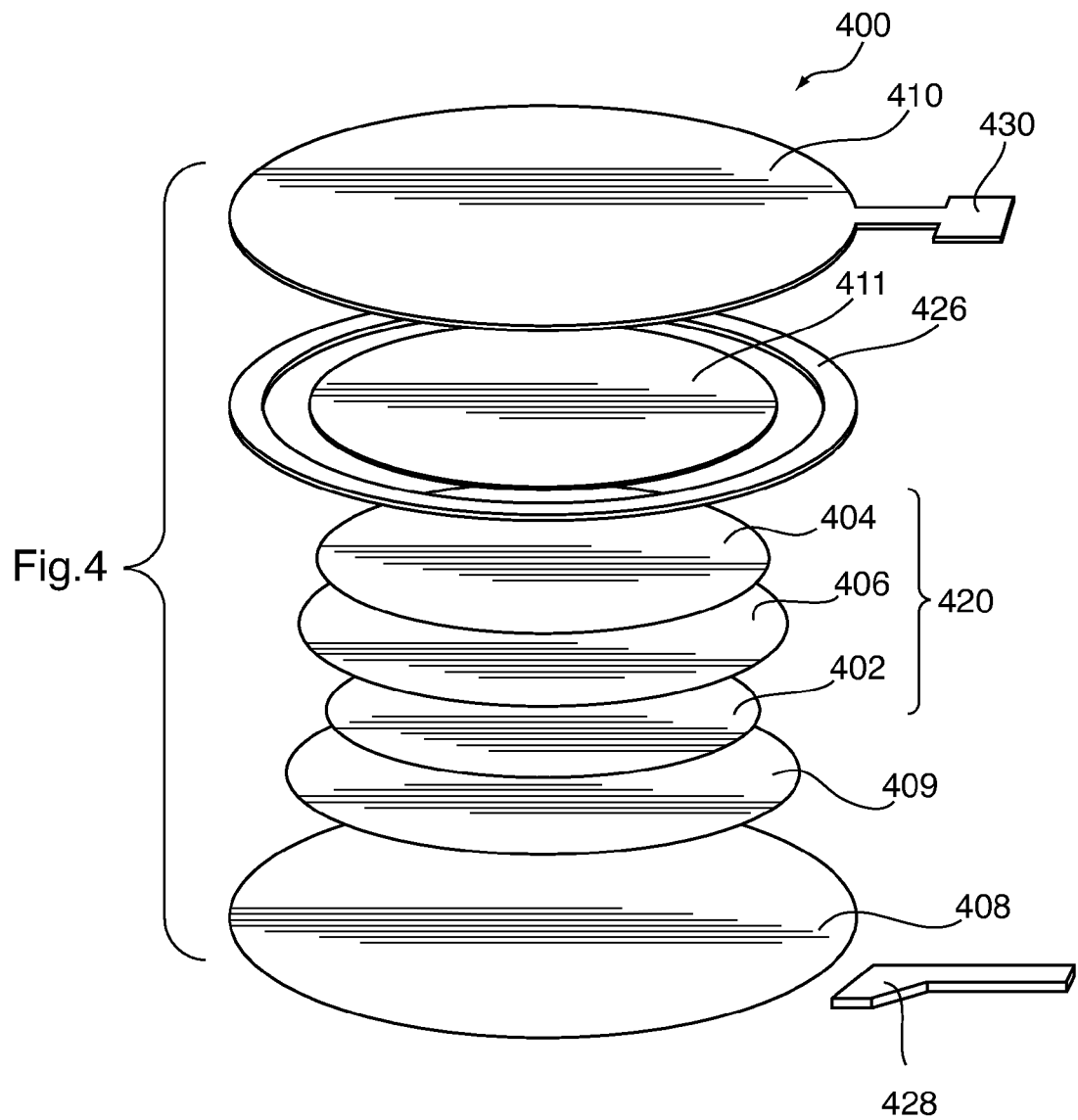
FIG. 4 is an exploded schematic of an example embodiment of a piezoelectric assembly.

Reference is now made to FIG. 4, showing a piezoelectric assembly 400 in an exploded schematic.

The piezoelectric assembly 400 comprises a first electrode 402 and a second electrode 404. The first electrode 402 and the second electrode 404 are spaced apart from each other. The first electrode 402 is in electrical communication with a power source, such as a current or voltage source. The second electrode 404 is in electrical communication with a reference source (e.g., a ground source). When electrical power, such as an electrical signal, is applied to the first electrode 402, an electric field is generated between the first and second electrodes 402, 404. In this example, the first and second electrodes 402, 404 are disc-shaped, although any suitable geometry is possible. In this example, the first electrode 402 has a diameter of about 13 mm and the second electrode 404 has a diameter of about 13 mm, although other sizes and shapes may be appropriate. The first and second electrodes 402, 404, in some examples, are made of any suitable electrically conductive material that accommodates flexing or displacement in the piezoelectric assembly, for example a silver material.

A piezoelectric element 406 is disposed between the first and second electrodes 402, 404 and is in electrical communication with each of the first and second electrodes 402, 404. The piezoelectric element 406 is made from a piezoelectric material such as a piezoelectric ceramic, for example, lead zirconate titanate (PZT). In this example, the electrical communication between the piezoelectric element 406 and the first and second electrodes 402, 404 is provided through direct contact. In some example embodiments, the piezoelectric element 406 may be designed to match the geometries of the first and second electrodes 402, 404, for example by being disc-shaped. In this example, the piezoelectric element 406 has a diameter of about 13 mm and is about 0.1 mm thick.

The piezoelectric element 406 has an unactuated state and an actuated state. In the absence of an electric field, the piezoelectric element 406 exhibits the unactuated state. For example, the piezoelectric element 406 may have an unflexed or unexpanded condition in the absence of the electric field. In the presence of an electrical field generated between the first and second electrodes 402, 404, for example when an electric field is generated between the first and the second electrodes 402, 404, the piezoelectric element 406 exhibits an actuated state. For example, the piezoelectric element 406 may have a flexed or expanded condition in the presence of an electric field. In the example shown, the first and second electrodes 402, 404, are bonded directly to the piezoelectric element 406, for example by silk-screening thin (e.g., 1-5 microns thick) silver first and second electrodes 402, 404 on opposing surfaces of the piezoelectric element 406. The first and second electrodes 402, 404 and the piezoelectric element 406 together form an electrode assembly 420.

The piezoelectric assembly 400 is in electrical communication (e.g., for receiving or transmitting signals) with other components of the electronic device 20 via electrical connectors. In the example shown, the piezoelectric assembly 400 includes a signal electrical connector 408 and a reference electrical connector 410. The signal electrical connector 408 is in electrical communication with the first electrode 402, for example through contact engagement with the first electrode 402, to provide electrical communication between the first electrode 402 and a current or voltage source. Similarly, the reference electrical connector 410 is in electrical communication with the second electrode 404, for example through contact engagement with the second electrode 404, to provide electrical communication between the second electrode 404 and a reference source. In some examples, the signal electrical connector 408 and the reference electrical connector 410 are, in turn, connected to or extensions from other components of the electrical device 20, such as other circuits. One of the signal electric connector 408 or the reference electrical connector 410 includes a metal shim. For example, in the embodiment illustrated, the signal electrical connector 408 is a form of metal shim.

In the example shown, the signal electrical connector 408 is a conductive metal disc about 20 mm in diameter (although other sizes may be appropriate), and is coupled to the first electrode 402 by a conductive adhesive 409, such as a conductive acrylic epoxy disc about 15 mm in diameter and 0.01 mm in thickness, although other materials with similar properties and other sizes may be suitable. For example, the disc of the signal electrical connector 408 and reference electrical connector 410 may each be any suitable electrically conductive material, such as a nickel alloy, and is suitably thick to provide support for the piezoelectric assembly 400. In this example, the disc of the signal electrical connector 408 and reference electrical connector 410 is about 0.10 mm to about 0.15 mm thick, with a diameter of about 20 mm, although other sizes may be suitable. In this respect, the signal electrical connector 408 and reference electrical connector 410 is designed to optimize or improve the mechanical response of the piezoelectric assembly 400, for example by providing robustness while allowing the piezoelectric element 406 to actuate or flex.

In the example shown, the reference electrical connector 410 is a flexible printed circuit board (PCB) disc about 18 mm in diameter, and is coupled to the second electrode 404 by a conductive adhesive 411, such as a conductive acrylic epoxy disc about 13 mm in diameter. Alternative materials with similar properties may be utilized and that reference electrical connector 410 and conductive adhesive 411 may have alternate dimensions to suit the application in other embodiments. In some examples, the flexible PCB comprises electronic devices or circuits (e.g., silver circuits) on a flexible plastic substrate. In some examples, the substrate is a flexible polymer such as polyimide, PEEK or polyester.

In some examples, the signal and reference electrical connectors 408, 410 are made of a material that is more resistant to fatigue than the first and second electrodes 402, 404 and the piezoelectric element 406.

When exposed to high humidity and high voltages (e.g., high AC voltages), there is a potential for the electrode assembly 420 to experience an electrical short failure. This electrical short can be induced by the migration of conductive material (e.g., silver) through the piezoelectric element 406 from the first electrode 402 (e.g., a positive electrode) to the second electrode 404 (e.g., a negative electrode).

In some embodiments, the signal electrical connector 408 extends over and covers a side surface of the first electrode 402 which is opposite to a side surface of the first electrode 402 which is disposed in contact engagement with the piezoelectric element 406 (to thereby effect the electrical communication between the first electrode 402 and the piezoelectric element 406). For example, the side surface over which the signal electrical connector 408 extends over and covers is at least 50% of the area of the side surface of the first electrode 402 which is opposite to the side surface of the first electrode 402 which is disposed in contact engagement with the piezoelectric material.

In some embodiments, the reference electrical connector 410 extends over and covers a side surface of the second electrode 404, which is opposite to a side surface of the second electrode 404 which is disposed in contact engagement with the piezoelectric element 406 (to thereby effect the electrical communication between the second electrode 404 and the piezoelectric element 406). For example, the side surface over which the reference electrical connector 410 extends over and covers is at least 50% of the area of the side surface of the second electrode 404, which is opposite to the side surface of the second electrode 404 that is disposed in contact engagement with the piezoelectric material.

The piezoelectric assembly 400 includes a spacer 426 positioned about the perimeter of the electrode assembly 420. The spacer 426 is disposed between the signal and reference electrical connectors 408, 410 such that no electrical communication is provided between the signal electrical connector 408 and the reference electrical connector 410 through the spacer 426. In the example shown, the spacer 426 forms a full ring about the perimeter of the electrode assembly 420 and is coupled to the signal and reference electrical connectors 408, 410 about the full perimeter of the electrode assembly 420. In the example shown, the spacer 426 is a non-conductive adhesive, such as a non-conductive adhesive tape, having an inner diameter of about 16 mm and an outer diameter of about 18 mm, and is coupled to each of the signal and reference electrical connectors 408, 410. However, it is contemplated that other materials with similar properties and alternative dimensions may be used. A suitable non-conductive adhesive tape is 3M™ VHB™ Adhesive Transfer Tape F9469PC. Thus, the spacer 426, in this example, is an annulus that is larger than the electrode assembly 420 but smaller than the signal and reference electrical connectors 408, 410. Although the spacer 426 is shown as an annulus, in some examples, the spacer 426 is not a full annulus, and contains one or more notches or gaps.

The electrode assembly 420 is disposed between the signal electrical connector 408, the reference electrical connector 410 and the spacer 426. In this example, the signal electrical connector 408, the reference electrical connector 410 and the spacer 426 together define a humidity barrier space within which the electrode assembly 420 is disposed. The signal and reference electrical connectors 408, 410 and the spacer 426, in some examples, are disposed in close contact with each other, forming a humidity barrier space with a substantially water-tight seal.

In some examples, the disposition of the electrode assembly 420 within the humidity barrier space helps to reduce the potential for humidity to reach the electrode assembly 420, thus helping to reduce the potential for migration of conductive material between the first and second electrodes 402, 404. This helps to increase the reliability and performance of the piezoelectric assembly 400.

In some examples, a signal source 428 is coupled to the signal electrical connector 408, such as by laser soldering. Similarly, in some examples, a reference source 430 is coupled to the reference electrical connector 410, such as by laser soldering, or by being formed integrally with the reference electrical connector 410.

The disclosed piezoelectric assembly 400 avoids the need to provide an additional humidity barrier, such as a silicone conformal coating, which in some cases requires increased infrastructure, assembly, time and overall cost during manufacturing.

Figure 5:
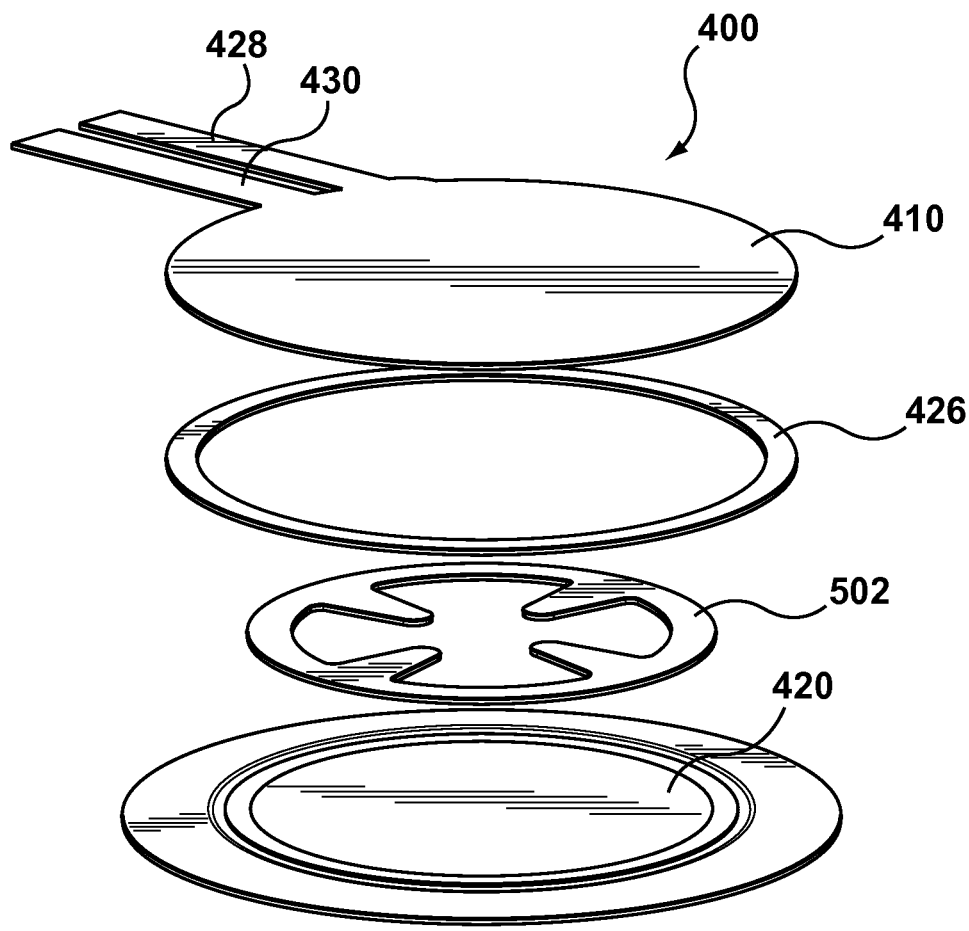
FIG. 5 is an exploded schematic of another example embodiment of a piezoelectric assembly.

Reference is now made to FIG. 5, showing an exploded schematic of another example embodiment of the piezoelectric assembly 400. In this example, one or both of the signal and reference electrical connectors 408, 410 is coupled to the electrode assembly 420 via a conductive adhesive 502.

In this example, the conductive adhesive 502 is provided between the reference electrical connector 410 and the electrode assembly 400. It should be understood that in some examples the conductive adhesive 502 can be provided between the signal electrical connector 408 and the electrode assembly 400, or between both the signal and reference electrical connectors 408, 410 and the respective surface of the electrode assembly 400. The conductive adhesive 502 is designed to be in contact engagement with a portion of the peripheral surface area of the first electrode 402, thereby maintaining contact with all portions of the first electrode 402, even in the presence of cracking. By peripheral surface area is meant the surface area of the first electrode 402 that is adjacent or substantially adjacent to the periphery of the first electrode 402, and is not necessarily limited to surface areas directly adjacent to the periphery of the first electrode 402. In some examples, the conductive adhesive 502 is designed with a piezoelectric material-accommodating space for accommodating actuation of the piezoelectric element 406. This piezoelectric material-accommodating space has the potential to reduce the rigidity of the piezoelectric assembly 400, thus reducing the work required for the piezoelectric element 406 to actuate and thereby allowing an increased response and increased tactile feedback.

In this example, the conductive adhesive 502 further includes one or more surfaces extending inwards from the periphery of the first electrode 402 for contact engagement with the first electrode 402. In the example shown, the conductive adhesive 502 includes, for example, four extensions extending radially inwards. Such a design has the potential to be useful for increasing the area of contact engagement between the conductive adhesive 502 and the first electrode 402. An increased contact engagement area has the potential to improve electrical communication between the signal electrical connector 408 and the first electrode 402. For example, an increased contact engagement area has the potential to provide a more robust electrical and physical contact.

Figure 6:
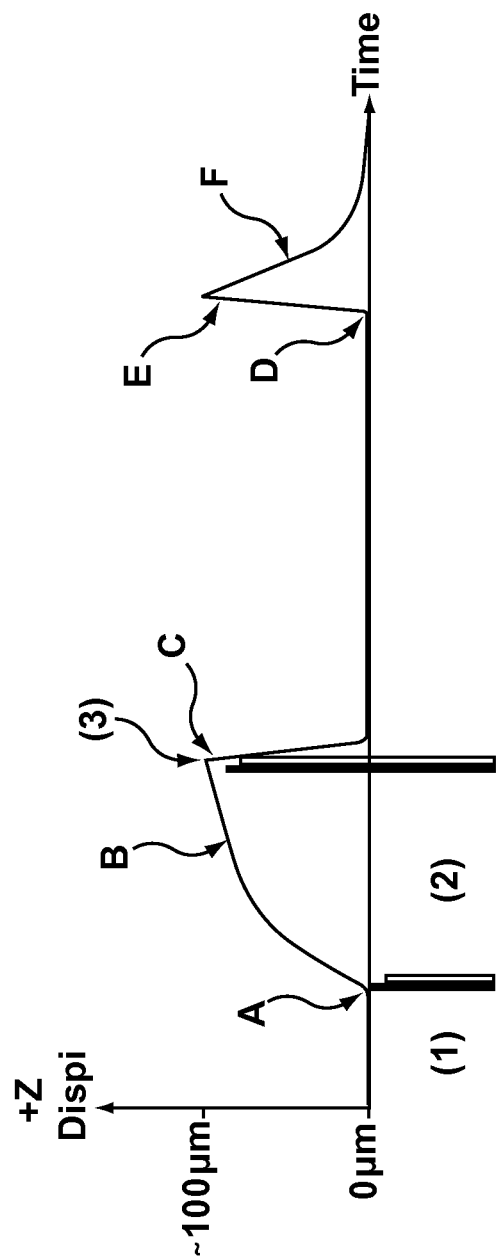
FIG. 6 is a chart illustrating displacement of an example embodiment of a piezoelectric assembly in operation.

Reference is now made to FIG. 6, which is a chart illustrating the displacement of an example embodiment of the piezoelectric assembly 400 in operation. In some examples, the piezoelectric assembly 400 is used as the tactile mechanism 39 described above.

At (1), when the piezoelectric assembly 400, does not receive a signal, in some examples there is no electric field generated between the first and second electrodes 402, 404, and the piezoelectric element 406 is in its unactuated state. The piezoelectric element 406 in this example is concave downwards from the general plane formed by its peripheral edge such that it is concave away from the touch-sensitive display 38, causing a corresponding configuration of the piezoelectric assembly 400.

At (A), in response to an initial touch input at the touch sensitive display 38, the piezoelectric assembly 400 receives a signal, for example from the processor 22, causing the generation of an electric field between the first and second electrodes 402, 404 and a subsequent change of the piezoelectric element 406 to its actuated state, which in this example brings the piezoelectric element 406 (and by extension the piezoelectric assembly 400) to be substantially planar with its peripheral edge and substantially flush or in contact with the touch sensitive display 38. This change to the actuated state typically occurs gradually enough to be unnoticeable by a user, as shown by the gradual rise (B). In this example, the piezoelectric assembly 400 exhibits a displacement of about 100 microns over about 20 ms from the unactuated to the actuated state.

Over the time period (2), the touch input at the touch sensitive display 38 exerts further force on the touch sensitive display 38, the force sensed by the touch sensitive display 38 increases until a predetermined threshold is reached at (3) and the touch input is determined to be a full touch input. When the full touch input is determined, the signal to the piezoelectric assembly 400 is stopped, causing the dissipation of the generated electric field between the first and second electrodes 402, 404 and a subsequent change of the piezoelectric element 406 back to its unactuated state (and by extension the piezoelectric assembly 400), which in this example is concaved away from the touch sensitive display 38. The change back to the unactuated state typically is relatively rapid so that the user feels the change, as shown by the sharp drop (C). In this example, the piezoelectric assembly 400 exhibits a displacement of about 100 microns over about 3 ms from the actuated to the unactuated state.

For the duration that the full touch input is maintained on the touch sensitive display 38, the piezoelectric assembly 400 remains unactuated. At (D) the touch input is removed, and this is sensed by the touch sensitive display 38. When the removal of the touch input is determined, a signal is sent to the piezoelectric assembly 400, again generating the electric field between the first and second electrodes 402, 404 and a subsequent change of the piezoelectric element 406 to its actuated state (and by extension the piezoelectric assembly 400), substantially flush with the touch sensitive display 38. Typically, this occurs relatively rapidly, such that the change is felt by the user, as shown by the sharp rise (D). In this example, the piezoelectric assembly 400 exhibits a displacement of about 100 microns over about 3 ms from the unactuated to the actuated state.

At (E), the signal to the piezoelectric assembly 400 is stopped, causing the generated electric field between the first and second electrodes 402, 404 to dissipate and thus the return of the piezoelectric material 406 to its unactuated state (and by extension the piezoelectric assembly 400). The piezoelectric assembly 400 typically exhibits a gradual return to the unactuated state, as shown by the gradual drop (F). In this example, the piezoelectric assembly 400 gradually returns to its unactuated state over about 15 ms.

Thus, in some examples, a user using a touch input on the touch sensitive display 38 initially feels a resistance in response to an initial touch input, as the piezoelectric assembly 400 changes to its substantially planar actuated state. As the touch input presses further down, the user feels a give or clicking sensation, as the piezoelectric assembly 400 returns to its concave unactuated state. When the touch input is released, the user feels an upwards clicking sensation, as the piezoelectric assembly 400 changes to its actuated state again, before finally relaxing back to its unactuated state. This behaviour has the potential to be useful to provide tactile feedback for the touch-sensitive display 38.

Although the piezoelectric assembly 400 has been described in certain variations and examples, the variations and examples described can be combined, and the piezoelectric assembly 400 can have a combination of any of the variations described. Although the signal electrical connector 408 is described as receiving a signal from a current or voltage source and communicating the signal to the first electrode 402, and the reference electrical connector 410 and second electrode 404 are described as being in electrical communication with a reference source, the roles signal and reference can be reversed, such that the first electrode 402 is in electrical communication with the reference source and the second electrode 404 is in electrical communication with the current or voltage source to receive a signal.

In the above description, for purposes of explanation, numerous details are set forth in order to provide a thorough understanding of the present disclosure. However, it will be apparent to one skilled in the art that these specific details are not required in order to practice the present disclosure. In other instances, well-known electrical structures and circuits are shown in block diagram form in order not to obscure the present disclosure. Although certain dimensions and materials are described for implementing the disclosed example embodiments, other suitable dimensions and/or materials can be used within the scope of this disclosure. All such modifications and variations, including all suitable current and future changes in technology, are believed to be within the sphere and scope of the present disclosure. All references mentioned are hereby incorporated by reference in their entirety.

The invention claimed is:

1. A piezoelectric assembly comprising:
    an electrode assembly;
    a signal electrical connector electrically connected to the electrode assembly;
    a reference electrical connector electrically connected to the electrode assembly; and
    a spacer positioned about a perimeter of the electrode assembly and disposed between the signal electrical connector and the reference electrical connector such that no electrical communication is provided between the signal electrical connector and the reference electrical connector through the spacer;
    wherein a humidity barrier space is defined between the signal electrical connector, the reference electrical connector and the spacer, wherein the signal electrical connector, the reference electrical connector and the spacer are disposed in close contact with each other to form a substantially water-tight seal which seals the humidity barrier space from an environment external to the humidity barrier space; and
    wherein the electrode assembly is disposed in the humidity barrier space.

2. The piezoelectric assembly of claim 1, wherein the piezoelectric element is disposed between the first and second electrodes.

3. The piezoelectric assembly of claim 1, wherein the spacer is positioned about the entire perimeter of the electrode assembly.

4. The piezoelectric assembly of claim 1, wherein the electrode assembly comprises a first electrode, a second electrode, and a piezoelectric material in electrical communication with each one of the first and second electrodes, wherein the piezoelectric material is provided in an unactuated state in the absence of an electric field generated between the first and second electrodes and is provided in an actuated state in the presence of the electric field.

5. The piezoelectric assembly of claim 4, wherein the spacer comprises a non-conductive adhesive, and wherein the spacer is disposed in close contact engagement with each of the signal electrical connector and the reference electrical connector.

6. The piezoelectric assembly of claim 4, wherein one of the signal electrical connector and the reference electrical connector supports the electrode assembly.

7. The piezoelectric assembly of claim 4, wherein the signal electrical connector is electrically connected to the first electrode and the reference electrical connector is electrically connected to the second electrode.

8. The piezoelectric assembly of claim 4, wherein each of the first and second electrodes are comprised of a silver material.

9. The piezoelectric assembly of claim 4, wherein each of the signal electrical connector and the reference electrical connector include a flexible material, the flexible material being more resistant to fatigue than the first and second electrodes.

10. The piezoelectric assembly of claim 4, wherein the signal electrical connector is coupled to the first electrode using a conductive adhesive.

11. The piezoelectric assembly of claim 4, wherein the reference electrical connector is coupled to the second electrode using a conductive adhesive.

12. The piezoelectric assembly of claim 4, wherein the signal electrical connector is configured for connection to a current or voltage source.

13. The piezoelectric assembly of claim 4, wherein the reference electrical connector is configured for connection to a reference source.

14. The piezoelectric assembly of claim 4, wherein the first electrode, second electrode and piezoelectric element are disc-shaped and the spacer is a ring-shaped.

15. The piezoelectric assembly of claim 4, wherein the signal electrical connector covers at least 50% of an area of a side surface of the first electrode which is opposite to a side surface of the first electrode which is disposed in contact engagement with the piezoelectric material.

16. The piezoelectric assembly of claim 15, wherein the signal electrical connector covers an entire area of the surface of the first electrode which is opposite to the side surface of the first electrode which is disposed in contact engagement with the piezoelectric material.

17. The piezoelectric assembly of claim 4, wherein the reference electrical connector covers at least 50% of the area of a side surface of the second electrode which is opposite to a side surface of the second electrode which is disposed in contact engagement with the piezoelectric material.

18. The piezoelectric assembly of claim 17, wherein the reference electrical connector covers an entire area of the surface of the second electrode which is opposite to the side surface of the second electrode which is disposed in contact engagement with the piezoelectric material.

19. A portable electronic device comprising:

a processor;

a touch-sensitive display coupled to the processor for accepting touch input;

a piezoelectric assembly coupled to the touch sensitive display for providing a tactile feedback in response to the touch input, the piezoelectric assembly including an electrode assembly, a signal electrical connector electrically connected to the electrode assembly, a reference electrical connector electrically connected to the electrode assembly, and a spacer positioned about a perimeter of the electrode assembly and disposed between the signal electrical connector and the reference electrical connector such that no electrical communication is provided between the signal electrical connector and the reference electrical connector through the spacer, wherein a humidity barrier space is defined between the signal electrical connector, the reference electrical connector and the spacer, wherein the signal electrical connector, the reference electrical connector and the spacer are disposed in close contact with each other to form a substantially water-tight seal which seals the humidity barrier space from an environment external to the humidity barrier space, and wherein the electrode assembly is disposed in the humidity barrier space.

20. The portable electronic device of claim 19, wherein the piezoelectric assembly is disposed adjacent to the touch-sensitive display, the piezoelectric assembly being in a concave configuration away from the touch-sensitive display in an unactuated state and being disposed in a substantially planar configuration flush with the touch-sensitive display in an actuated state, the piezoelectric assembly being actuated in response to a signal representing a touch input and being unactuated in the absence of the signal representing the touch input.

* * * * *